(12) United States Patent
Jeon et al.

(10) Patent No.: US 8,003,017 B2
(45) Date of Patent: Aug. 23, 2011

(54) ADHESIVE COMPOSITION AND ANISOTROPIC CONDUCTIVE FILM USING THE SAME

(75) Inventors: Byeong Hwan Jeon, Uiwang-si (KR); Kyoung Soo Park, Uiwang-si (KR); Bong Yong Kim, Uiwang-si (KR); Young Jin Kwon, Uiwang-si (KR); Kang Bae Yoon, Uiwang-si (KR); Kyong Hun Shin, Uiwang-si (KR); Hyun Hee Namkung, Uiwang-si (KR); Hyun Joo Seo, Uiwang-si (KR); Cheon Seok Lee, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 173 days.

(21) Appl. No.: 12/314,882

(22) Filed: Dec. 18, 2008

(65) Prior Publication Data

US 2009/0152505 A1 Jun. 18, 2009

(30) Foreign Application Priority Data

Dec. 18, 2007 (KR) ........................ 10-2007-0133085

(51) Int. Cl.
*H01B 1/22* (2006.01)
*H01B 1/20* (2006.01)
*H01B 1/24* (2006.01)
*C08L 33/08* (2006.01)

(52) U.S. Cl. ........ 252/511; 252/510; 252/513; 252/514; 252/512; 252/500; 525/227; 525/205; 525/207; 525/208; 525/185; 525/190; 524/502; 522/111

(58) Field of Classification Search .................. 252/511, 252/510, 513, 514, 512, 500; 525/227, 205, 525/207, 208, 185, 190; 524/502; 522/111
See application file for complete search history.

(56) References Cited

U.S. PATENT DOCUMENTS

| | | | |
|---|---|---|---|
| 4,731,282 A * | 3/1988 | Tsukagoshi et al. | 428/220 |
| 5,434,213 A | 7/1995 | Chen et al. | |
| 5,597,865 A | 1/1997 | Jackson | |
| 5,686,703 A * | 11/1997 | Yamaguchi | 174/259 |
| 5,776,234 A | 7/1998 | Schilling | |
| 5,998,545 A | 12/1999 | Melot et al. | |
| 6,045,902 A * | 4/2000 | Imanishi et al. | 428/327 |
| 6,063,838 A * | 5/2000 | Patnode et al. | 523/172 |
| 7,176,151 B2 | 2/2007 | Trochlil et al. | |

FOREIGN PATENT DOCUMENTS

| | | |
|---|---|---|
| JP | 03-290282 | 12/1991 |
| KR | 2003037017 A * | 5/2003 |
| KR | 776138 B1 * | 11/2007 |

OTHER PUBLICATIONS

CAS Reg. No. 24937-78-8, Nov. 16, 1984.*
CAS Reg. No. 9011-13-6, Nov. 16, 1984.*
Concise Science Dictionary, Oxford University Press, 1984, pp. 18 and 19.*

* cited by examiner

*Primary Examiner* — Douglas Mc Ginty
(74) *Attorney, Agent, or Firm* — Lee & Morse, P.C.

(57) ABSTRACT

An adhesive composition includes an ethylene-vinyl acetate copolymer, a copolymer of an aliphatic heterocyclic compound and a monomer having an aromatic ring, a binder resin, a radical polymerizable material, and a radical initiator.

12 Claims, 3 Drawing Sheets

FIG. 1

TABLE 1: Measurement results of adhesive strength (gf/cm) measured after evaluation of initial reliability

| | Initial | Final pressing conditions: 160°C, 4 sec, 3 MPa | |
|---|---|---|---|
| | | High temp., high RH, 500 hr | Thermal shock, 500 cycles |
| Example 1-1 | 1,001 | 1,075 | 1,066 |
| Example 1-2 | 1,055 | 1,124 | 1,200 |
| Example 2-1 | 1,098 | 1,337 | 1,353 |
| Example 2-2 | 1,122 | 1,188 | 1,289 |
| Comparative Example 1-1 | 866 | 484 | 505 |
| Comparative Example 1-2 | 818 | 402 | 447 |
| Comparative Example 1-3 | 1,215 | 884 | 802 |
| Comparative Example 2-1 | 1,254 | 612 | 634 |
| Comparative Example 2-2 | 970 | 533 | 633 |
| Comparative Example 2-3 | 1,248 | 894 | 772 |

FIG. 2

TABLE 2: Measurement results of electrical resistance (Ω) measured after evaluation of initial reliability

| | Final pressing conditions: 160°C, 4 sec, 3 MPa | | | Final pressing conditions: 200°C, 4 sec, 3 MPa | | |
|---|---|---|---|---|---|---|
| | Initial | High temp., high RH, 500 hr | Thermal shock, 500 cycles | Initial | High temp., high RH, 500 hr | Thermal shock, 500 cycles |
| Example 1-1 | 1.25 | 1.42 | 1.41 | 1.18 | 1.32 | 1.22 |
| Example 1-2 | 1.22 | 1.34 | 1.37 | 1.15 | 1.24 | 1.23 |
| Example 2-1 | 1.34 | 1.37 | 1.42 | 1.22 | 1.32 | 1.24 |
| Example 2-2 | 1.43 | 1.45 | 1.49 | 1.34 | 1.36 | 1.42 |
| Comp. Example 1-1 | 1.47 | 5.71 | 4.68 | 1.72 | 5.95 | 4.72 |
| Comp. Example 1-2 | 1.41 | 4.27 | 4.58 | 1.65 | 5.25 | 4.22 |
| Comp. Example 1-3 | 1.42 | 3.54 | 3.42 | 1.55 | 4.28 | 3.44 |
| Comp. Example 2-1 | 1.39 | 3.32 | 3.31 | 1.42 | 4.53 | 3.75 |
| Comp. Example 2-2 | 1.37 | 3.86 | 3.55 | 1.45 | 5.65 | 4.95 |
| Comp. Example 2-3 | 1.32 | 2.74 | 2.99 | 1.39 | 3.35 | 3.28 |

FIG. 3

TABLE 3: Evaluation of fluidity (%) and bonding gap (μm)

Final pressing conditions: 160°C, 4 sec, 3 MPa/200°C, 4 sec, 3 MPa

| | Fluidity (%) | | Bonding gap (μm) | |
|---|---|---|---|---|
| | 160°C | 200°C | 160°C | 200°C |
| Example 1-1 | 81 | 95 | 1.2 | 0.8 |
| Example 1-2 | 83 | 98 | 1.1 | 0.9 |
| Example 2-1 | 77 | 87 | 2.0 | 1.6 |
| Example 2-2 | 78 | 89 | 1.9 | 1.7 |
| Comparative Example 1-1 | 65 | 78 | 6.2 | 7.5 |
| Comparative Example 1-2 | 69 | 80 | 5.7 | 6.3 |
| Comparative Example 1-3 | 71 | 83 | 6.8 | 8.5 |
| Comparative Example 2-1 | 64 | 76 | 4.5 | 4.8 |
| Comparative Example 2-2 | 67 | 78 | 4.7 | 5.6 |
| Comparative Example 2-3 | 70 | 82 | 4.1 | 5.2 |

ADHESIVE COMPOSITION AND ANISOTROPIC CONDUCTIVE FILM USING THE SAME

BACKGROUND OF THE INVENTION

1. Field of the Invention

Embodiments relate to an adhesive composition suitable for producing an anisotropic conductive film (hereinafter, also referred to as an 'anisotropic conductive film composition' or simply as an 'ACF composition') and an anisotropic conductive film using the same.

2. Description of the Related Art

Adhesives have been used extensively in various application fields, including electrical and electronic devices. Various adhesives in the form of films are currently used to provide better processability in the fabrication of electric and electronic devices.

Adhesives in the form of films for circuit connection may be broadly classified into non-conductive films (NCFs) and anisotropic conductive films (ACFs) based on the absence or presence of conductive particles. The anisotropic conductive films generally refer to films in which conductive particles such as metal particles, e.g., nickel (Ni), copper (Cu) or gold (Au) particles, or metal-coated polymer particles are dispersed.

An anisotropic conductive film may be positioned between circuits, followed by heating and pressing under specific conditions to electrically connect the circuit terminals through conductive particles. An electrically insulating adhesive resin may be filled in a space between the adjacent circuit terminals to render the conductive particles electrically independent from one another. The resin may insulate the conductive particles. Generally, anisotropic conductive films are widely used for the electrical connection of LCD panels or printed circuit boards (PCBS) and tape carrier packages (TCPs).

A typical adhesive composition used to the form a film may include a film-forming polymeric binder resin and a curing system that is cured upon exposure to energy, e.g., heat or UV, to make a connection structure hard. The anisotropic conductive film composition may further include conductive particles and one or more additives to obtain better physical properties.

SUMMARY OF THE INVENTION

Embodiments are therefore directed to an adhesive composition and an anisotropic conductive film using the same, which substantially overcome one or more of the problems due to the limitations and disadvantages of the prior art.

It is therefore a feature of an embodiment to provide an anisotropic conductive film with increased adhesive strength, reliability, and electrical connection capability under high temperature and high humidity conditions.

It is therefore a feature of an embodiment to provide an anisotropic conductive film with increased adhesive strength reliability, and electrical connection capability under thermal shock conditions.

It is therefore a feature of an embodiment to provide an anisotropic conductive film with high fluidity and small bonding gaps.

At least one of the above and other features and advantages may be realized by providing an adhesive composition, the composition including an ethylene-vinyl acetate copolymer, a copolymer of an aliphatic heterocyclic compound and a monomer having an aromatic ring, a radical polymerizable material, and a radical initiator.

The composition may include about 10 to about 40% by weight of the ethylene-vinyl acetate copolymer, about 5 to about 20% by weight of the copolymer, about 1 to about 20% by weight of the binder resin, about 30 to about 60% by weight of the radical polymerizable material, and about 0.5 to about 5% by weight of the radical initiator.

The composition may further include conductive particles. The conductive particles may be present in an amount of about 0.01 to about 3% by weight.

The composition may further include about 0.1 to about 5% by weight of a coupling agent.

The composition may further include about 0.05 to about 0.5% by weight of an additive including at least one of a polymerization inhibitor, an antioxidant, and a heat stabilizer.

The ethylene-vinyl acetate copolymer may contain vinyl acetate units in an amount of about 20 to about 80% by weight, based on the total weight of the ethylene-vinyl acetate copolymer.

The aliphatic heterocyclic compound may include at least one of maleic anhydride and maleimide, and the monomer may include styrene.

The copolymer may include a styrene-maleic anhydride copolymer whose styrene content is about 50% or greater, based on the total weight of the styrene-maleic anhydride copolymer.

The binder resin may have a weight average molecular weight of about 10,000 to about 1,000,000 and may include at least one of a polyvinyl butyral resin, a polyvinyl formal resin, a polyester resin, a phenolic resin, an epoxy resin, a phenoxy resin, a urethane resin, and an acrylic resin.

The radical polymerizable material may include at least one of an acrylate, a methacrylate, a maleimide compound, and a compound having a phosphate structure.

The radical initiator may include at least one of a photo-polymerization initiator and a heat curing initiator.

At least one of the above and other features and advantages may also be realized by providing an anisotropic conductive film produced using an adhesive composition according to an embodiment. The anisotropic conductive film may include an ethylene-vinyl acetate copolymer, a copolymer of an aliphatic heterocyclic compound and a monomer having an aromatic ring, a binder, and a polymeric material.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 1 illustrates Table 1 listing initial adhesive strength and adhesion reliability for samples prepared in Examples 1 and 2 and Comparative Examples 1 and 2;

FIG. 2 illustrates Table 2 listing electrical resistance for samples prepared in Examples 1 and 2 and Comparative Examples 1 and 2; and FIG. 3 illustrates Table 3 listing fluidity and bonding gap for samples prepared in Examples 1 and 2 and Comparative Examples 1 and 2.

DETAILED DESCRIPTION OF THE INVENTION

Korean Patent Application No. 10-2007-0133085, filed on Dec. 18, 2007, in the Korean Intellectual Property Office, and entitled: "Adhesive Composition and Anisotropic Conductive Film Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a peroxide initiator" may represent a single compound, e.g., t-butyl peroxylaurate, or multiple compounds in combination, e.g., t-butyl peroxylaurate mixed with octanoyl peroxide.

As used herein, molecular weights of polymeric materials are weight average molecular weights, unless otherwise indicated.

As used herein, the language "parts by weight, based on the total amount of the adhesive film composition" and "% by weight" is exclusive of solvent, unless otherwise indicated. That is, as used herein, the point of reference "the total amount of the adhesive film composition" does not include solvent. For example, where a composition is composed of two components A and B, with A present in 35 parts by weight and B present in 65 parts by weight, based on the total amount of the adhesive film composition, the addition of 10 parts by weight of solvent to the composition would result in the composition continuing to have 35 parts by weight A and 65 parts by weight B, based on the total amount of the adhesive film composition.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

An embodiment provides an adhesive composition suitable for forming an anisotropic conductive film, the composition including mainly two parts. The first part is the film forming resin, which forms a film structure and may provide the film with tackiness due to the presence of polar functional groups, e.g., hydroxyl groups, carboxyl groups, or the like. The film forming resin may include an ethylene-vinyl acetate copolymer, a copolymer of an aliphatic heterocyclic compound and a monomer having an aromatic ring, and a binder resin. The second part is the curing part, which may be cured, e.g., by thermal or UV energy, and may include a radical polymerizable material and a radical initiator. The composition may also include conductive particles, a coupling agent, and an additive. Explanation will be made for the individual components of the composition below.

Ethylene-Vinyl Acetate Copolymer

In an embodiment, the ethylene-vinyl acetate copolymer is preferably present in an amount of about 10 to about 40% by weight, more preferably about 20 to about 40% by weight, and most preferably about 20 to about 30% by weight, based on the total weight of the anisotropic conductive film composition. Maintaining the amount of the ethylene-vinyl acetate copolymer at about 10% by weight or greater may help ensure sufficient flow of the adhesive composition upon final pressing, avoiding an unstable connection state of the anisotropic conductive film. Maintaining the amount of the ethylene-vinyl acetate copolymer at about 40% by weight or less may help ensure sufficient strength of the anisotropic conductive film, avoiding poor long-term connection reliability of the anisotropic conductive film in a connection structure.

The ethylene-vinyl acetate copolymer preferably has a weight average molecular weight of about 10,000 to about 1,000,000, within which the film-forming properties may be optimized for the production of the anisotropic conductive film.

Preferably, the content of vinyl acetate units in the ethylene-vinyl acetate copolymer is about 20 to about 80% by weight, based on the total weight of the ethylene-vinyl acetate copolymer. More preferably, the content of vinyl acetate units in the ethylene-vinyl acetate copolymer is about 40 to about 70% by weight, based on the total weight of the ethylene-vinyl acetate copolymer.

When the vinyl acetate units are present in an amount of 20% by weight, which corresponds to 24.5% on a molar basis, the backbone of the ethylene-vinyl acetate copolymer is substantially composed of ethylene units. As the content of the vinyl acetate units becomes higher, the ethylene-vinyl acetate copolymer may show better solubility and higher tack properties in the other components of the anisotropic conductive film composition. When it is intended to use the ethylene-vinyl acetate copolymer as an anisotropic conductive film composition component, it may be necessary to mix the ethylene-vinyl acetate copolymer with one or more components for the purpose of achieving good physical properties, such as high processability, due to its high melt index (MI) ranging from 2 to 500.

Maintaining the amount of the vinyl acetate units at about 20% by weight or greater may help ensure a sufficient flow can be obtained upon crosslinking (curing) at a low temperature. Maintaining the amount of the vinyl acetate units at about 80% by weight or less may help ensure that the softening temperature of the adhesive composition is not too low, avoiding problems in terms of storage stability and actual use.

Copolymer of aliphatic heterocyclic compound and monomer having aromatic ring

In an embodiment, the aliphatic heterocyclic compound may include maleic anhydride or maleimide, and the monomer having an aromatic ring may include styrene.

In an embodiment, the copolymer is preferably present in an amount of about 5 to about 20% by weight, more preferably about 10 to about 20% by weight, and most preferably about 10 to about 15% by weight, based on the total weight of the anisotropic conductive film composition. Maintaining the amount of the copolymer at about 5% by weight or greater may help ensure sufficient strength of the anisotropic conductive film, avoid excessive tackiness, and ease film molding. Maintaining the amount of the copolymer at about 20% by weight or less may help ensure sufficient miscibility, avoiding phase separation in the course of preparing the anisotropic conductive film composition.

The copolymer preferably has a weight average molecular weight of about 1,000 to about 100,000. Maintaining the weight average molecular weight of the copolymer at about 1,000 or greater may help ensure that satisfactory strength and breaking elongation of the anisotropic conductive film are obtained. Maintaining the weight average molecular weight of the copolymer at about 100,000 or less may help ensure miscibility with the other components, avoiding phase separation in the course of preparing the anisotropic conductive film composition. Maintaining the weight average molecular weight of the polymer at about 100,000 or less may also help ensure that adhesion does not deteriorate.

The copolymer may have a glass transition temperature as high as room temperature, which may afford the anisotropic conductive film composition with excellent characteristics in terms of heat resistance, humidity resistance, and connection stability. Particularly, the use of the maleimide or maleic anhydride compound may contribute to an improvement in miscibility and wettability, and may provide good adhesion to an adherend.

Preferably, the copolymer of an aliphatic heterocyclic compound and a monomer having an aromatic ring is a styrene-maleic anhydride copolymer. The content of styrene units in the styrene-maleic anhydride copolymer is preferably about 50% by weight or greater, more preferably about 70% by weight or greater, and most preferably about 80% by weight or greater, based on the total weight of the copolymer. Maintaining the styrene content at about 50% by weight or greater, based on the total weight of the copolymer, may help ensure that the heat resistance of the adhesive composition is not deteriorated, avoiding poor long-term connection reliability of the anisotropic conductive film in a connection structure.

Binder Resin

The binder resin is the component of the film forming resin that does not include either an ethylene-vinyl acetate copolymer or a copolymer of aliphatic heterocyclic compound and a monomer having an aromatic ring.

The binder resin may function to improve the film-forming properties and heat resistance of the anisotropic conductive film composition. In an embodiment, the binder resin is preferably present in an amount of about 1 to about 20% by weight, more preferably about 5 to about 20% by weight, and most preferably about 10 to about 20% by weight, based on the total weight of the anisotropic conductive film composition. Maintaining the amount of the binder resin at about 1% by weight or greater may help ensure sufficient solution stability, ability to form a film, and sufficient adhesive strength. Maintaining the amount of the binder resin at about 20% by weight or less may help ensure sufficient mechanical properties, e.g., hardness, of the anisotropic conductive film.

In an embodiment, the binder resin preferably has a weight average molecular weight of about 10,000 to about 1,000,000. Maintaining the weight average molecular weight of the binder resin at about 10,000 or greater may help ensure miscibility with the radical polymerizable material during curing, avoiding phase separation in the course of preparing the anisotropic conductive film composition. Maintaining the weight average molecular weight of the binder resin at about 1,000,000 or less may help ensure excessive tack properties are not exhibited and thereby easing film molding.

In an embodiment, the binder resin may include at least one of polyvinyl butyral, polyvinyl formal, polyester, phenolic resins, epoxy resins, phenoxy resins, and polymerizable acrylic resins.

Radical Polymerizable Material

Any suitable material that can be cured by heat or energy radiation may be used as the radical polymerizable material. The radical polymerizable material may include at least one of acrylates, methacrylates, maleimide compounds, and compounds having a phosphate ester structure. These radical polymerizable materials may be used in either monomeric or oligomeric form, or in a combination of monomeric and oligomeric forms.

The acrylates and methacrylates may include at least one of methyl(meth)acrylate, ethyl(meth)acrylate, isopropyl(meth)acrylate, isobutyl(meth)acrylate, ethylene glycol(meth)acrylate, diethylene glycol di(meth)acrylate, trimethylolpropane tri(meth)acrylate, tetramethylolmethane tetra(meth)acrylate, 2-hydroxy-1,3-di(meth)acryloxypropane, 2,2-bis[4-((meth)acryloxy polymethoxy)phenyl]propane, 2,2-bis[4-((meth)acryloxy polyethoxy)phenyl]propane, dicyclopentenyl (meth)acrylate, tricyclodecanyl(meth)acrylate, and tris((meth)acryloyloxyethyl)isocyanurate.

The maleimide compounds may include at least one of 1-methyl-2,4-bismaleimide benzene, N,N'-m-phenylenebismaleimide, N,N'-p-phenylenebismaleimide, N,N'-m-tolylenebismaleimide, N,N'-4,4-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenylsulfonebismaleimide, 2,2-bis(4-(4-maleimidophenoxy)phenyl)propane, 2,2-bis(3-s-butyl-4-(4-maleimidophenoxy)phenyl)propane, 1,1-bis(4-(4-maleimidophenoxy)phenyl)decane, 4,4'-cyclohexylidene bis(1-(4 maleimidophenoxy)-2-cyclohexylbenzene, and 2,2-bis(4-(4 maleimidophenoxy)phenyl)hexafluoropropane, each of which contains at least two maleimide groups in the molecule.

For better adhesive strength and room temperature stability, the radical polymerizable material may include a compound having a phosphate ester structure. The compound having a phosphate ester structure is preferably present in an amount of about 0.5 to about 10% by weight, more preferably about 0.5 to about 5% by weight, and most preferably about 2 to about 5% by weight, based on the total weight of the adhesive composition. The compound having a phosphate ester structure may include a reaction product of phosphoric anhydride and 2-hydroxyethyl(meth)acrylate.

The radical polymerizable material may be cured to ensure the adhesive strength and connection reliability between layers to be connected. The radical polymerizable material is preferably present in an amount of about 30 to about 60% by weight, more preferably about 30 to about 50% by weight, and most preferably about 40 to about 50% by weight, based on the total weight of the anisotropic conductive film composition. Maintaining the amount of the radical polymerizable material at about 30% by weight or greater may help ensure sufficient crosslinking density after final pressing, avoiding a deterioration in reliability and fluidity. As a result, sufficient contact between conductive particles and circuit substrates, and lower connection resistance at the time of bonding may lead to higher connection reliability. Maintaining the amount of the radical polymerizable material at about 60% by weight or less may help ensure ease of production of the anisotropic conductive film and sufficient adhesiveness.

Radical Initiator

In an embodiment, the radical initiator may include at least one of a photopolymerization initiator and a heat curing initiator.

The photopolymerization initiator may include at least one of benzophenone, methyl o-benzoylbenzoate, 4-benzoyl-4-methyldiphenyl sulfide, isopropylthioxanthone, diethylthioxanthone, ethyl 4-ethylbenzoate, benzoin ether, benzoin propyl ether, 2-hydroxy-2-methyl-1-phenylpropan-1-on, and diethoxy acetophenone.

The heat curing initiator may include at least one of a peroxide initiator and an azo initiator.

The peroxide initiator may include at least one of t-butyl peroxylaurate, 1,1,3,3-t-methylbutylperoxy-2-ethylhexanoate, 2,5-dimethyl-2,5-di(2-ethylhexanoylperoxy)hexane, 1-cyclohexyl-1-methylethyl peroxy-2-ethylhexanoate, 2,5-dimethyl-2,5-di(m-toluoylperoxy)hexane, t-butylperoxyisopropyl monocarbonate, t-butyl peroxy-2-ethylhexyl monocarbonate, t-hexyl peroxybenzoate, t-butyl peroxyacetate, dicumyl peroxide, 2,5,-dimethyl-2,5-di(t-butylperoxy)hexane, t-butylcumyl peroxide, t-hexyl peroxyneodecanoate, t-hexyl peroxy-2-ethylhexanoate, t-butyl peroxy-2-2-ethylhexanoate, t-butyl peroxyisobutyrate, 1,1-bis(t-butylperoxy)cyclohexane, t-hexyl peroxy isopropyl monocarbonate, t-butylperoxy-3,5,5-trimethylhexanoate, t-butyl peroxypivalate, cumyl peroxyneodecanoate, diisopropylbenzene hydroperoxide, cumene hydroperoxide, isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoyl peroxide, 3,5,5-trimethylhexanoyl peroxide, benzoyl peroxy toluene, 1,1,3,3-tetramethylbutyl peroxyneodecanoate, 1-cyclohexyl-1-methylethyl peroxyneodecanoate, di-n-propyl peroxydicarbonate, diisopropyl peroxycarbonate, bis(4-t-butylcyclohexyl)peroxydicarbonate, di-2-ethoxymethoxy peroxydicarbonate, di(2-ethylhexylperoxy) dicarbonate, dimethoxybutyl peroxydicarbonate, di(3-methyl-3-methoxybutylperoxy)dicarbonate, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane,t-butyltrimethylsilyl peroxide, bis(t-butyl)dimethylsilyl peroxide,t-butyltriallylsilyl peroxide, bis(t-butyl)diallylsilyl peroxide, and tris(t-butyl)allylsilyl peroxide.

The azo initiator may include at least one of 2,2'-azobis(4-methoxy-2,4-dimethylvaleronitrile), dimethyl 2,2'-azobis(2-methylpropionate), 2,2'-azobis(N-cyclohexyl-2-methylpropionamide), 2,2-azobis(2,4-dimethylvaleronitrile), 2,2'-azobis(2-methylbutyronitrile), 2,2'-azobis[N-(2-propenyl)-2-methylpropionamide], 2,2'-azobis(N-butyl-2-methylpropionamide), 2,2'-azobis[N-(2-propenyl)-2-methylpropionamide], 1,1'-azobis(cyclohexane-1-carbonitrile), and 1-[(cyano-1-methylethyl)azo]formamide.

The radical initiator may function to generate radicals necessary for the heat curing system to initiate curing reactions. The radical initiator is preferably present in an amount of about 0.5 to about 5% by weight, more preferably about 1 to about 3% by weight, and most preferably about 1 to about 2% by weight, based on the total weight of the anisotropic conductive film composition. Maintaining the amount of the radical initiator at about 0.5% by weight or greater may help ensure that the curing reactions are not retarded, avoiding a deterioration in physical properties after final pressing. Maintaining the amount of the radical initiator at about 5% by weight or less may help ensure that the brittleness of the anisotropic conductive film does not increase after heat curing. A lower brittleness may help ensure that the anisotropic conductive film is able to be completely removed during rework.

Conductive Particles

The anisotropic conductive film composition of an embodiment may provide excellent connection properties even without conductive particles in the case adherends may have a suitable surface roughness, e.g., a surface roughness of about 0.1 to about 0.5 μm. Also, as the content of conductive particles in the anisotropic conductive film composition decreases, the number of insulation defects may likewise decrease. Accordingly, the anisotropic conductive film composition of an embodiment is suitable for fine pitch applications. To achieve improved conductivity, however, the anisotropic conductive film composition of an embodiment may include conductive particles.

The conductive particles may include at least one of metal particles, e.g., Au, Ag, Ni, Cu, Sn, and Pb particles; carbon particles; metal-coated resin particles, e.g., particles of benzoguanamine, polymethylmethacrylate, an acrylic copolymer, polystyrene, or a modified resin thereof coated with Au, Ag, Ni, Cu, or Sn; and conductive particles coated with insulating particles.

The size of the conductive particles may be determined depending on the pitch of circuits to which the film is to be applied, and may be about 1 to about 30 μm according to the intended application. The conductive particles may have different sizes.

The conductive particles may be used to improve the conductivity of the film formed using the adhesive composition according to an embodiment upon circuit connection. When the conductive particles are included in the adhesive composition, the conductive particles are preferably present in an amount of about 0.01 to about 3% by weight, more preferably about 0.5 to about 3% by weight, and most preferably about 1 to about 2% by weight, based on the total weight of the anisotropic conductive film composition. Maintaining the amount of the conductive particles at about 3% by weight or less may help ensure insulation reliability between fine circuits to be connected, thus ensuring anisotropic conductivity.

Coupling Agent

The anisotropic conductive film composition of an embodiment may further include a coupling agent that may serve to improve the adhesive strength between the surface of an inorganic material, e.g., copper or glass, and the resin of the anisotropic conductive film upon blending. The coupling agent may also enhance the resistance to heat and humidity, thus achieving improved connection reliability. The coupling agent is preferably used in an amount of about 0.1 to about 5% by weight, more preferably about 0.1 to about 2% by weight, and most preferably about 0.5 to about 2% by weight, based on the total weight of the anisotropic conductive film composition. Maintaining the amount of the coupling agent at about 5% by weight or less may help ensure the adhesive composition is cohesive, exhibiting good adhesive strength and reliability. Preferably, a silane coupling agent is used in the anisotropic conductive film composition.

Additives

The anisotropic conductive film composition may further include an additive including at least one of polymerization inhibitors, antioxidants, and heat stabilizers, to achieve improved physical properties without damage to the basic physical properties. The additive is preferably present in an amount of about 0.05 to about 0.5% by weight, more preferably about 0.05 to about 0.3% by weight, and most preferably about 0.05 to about 0.1% by weight, based on the total weight of the anisotropic conductive film composition.

The polymerization inhibitor may be added to achieve improved room temperature stability. The polymerization inhibitor may include at least one of hydroquinone, hydroquinone monomethyl ether, p-benzoquinone, and phenothiazine.

The antioxidant may be added to prevent oxidation induced by heat, and impart heat stability to the final anisotropic conductive film composition. The antioxidant may include at least one of branched phenols and hydroxycinnamates, e.g., tetrakis-(methylene-(3,5-di-t-butyl-4-hydrocinnamate) methane, 3,5-bis(1,1-dimethylethyl)-4-hydroxybenzenepropanoic acid, thiol di-2,1-ethanediyl ester, octadecyl 3,5-di-t-butyl-4-hydroxyhydrocinnamate, all of which are commercially available from Ciba, and 2,6-di-t-butyl-p-methylphenol.

A general apparatus or equipment may be used to produce an anisotropic conductive film using the adhesive composition according to an embodiment. For example, an anisotropic conductive film having a monolayer structure may be produced by adding the anisotropic conductive film composition to a suitable organic solvent, e.g., toluene, stirring the solution for a time sufficient to completely dissolve the anisotropic conductive film composition, applying the solution to a thickness of about 10 to about 50 μm to a release film, and drying the resulting structure for a time sufficient to evaporate the organic solvent.

A more detailed description of exemplary embodiments will be described with reference to the following examples. However, these examples are given merely for the purpose of illustration and are not to be construed as limiting the scope of the embodiments.

EXAMPLES

Example 1-1

An adhesive composition was prepared by mixing the following components:
i) A solution of 94.3 g of an ethylene-vinyl acetate copolymer (EVA 700, BAYER), whose vinyl acetate content is 70 wt %, in toluene/methyl ethyl ketone (35 vol %)
ii) A solution of 12.5 g of a styrene-maleimide copolymer (SMA 3000I Resin, SARTOMER), whose styrene content is 75 wt %, in methyl ethyl ketone (40 vol %)
iii) A solution of 50 g of an acrylic resin (SG-80, Nagase Chemtex Corp. (Japan)), whose weight average molecular weight is 350,000, in toluene (20 vol %)
iv) 38 g of an epoxy acrylate polymer (SP1509, Showa Highpolymer (Japan)), 5 g of trimethylolpropane trimethacrylate and 6 g of 2-methacryloyloxyethyl phosphate as radical polymerizable materials
v) A solution of 30 g of benzoyl peroxide as a radical initiator in toluene (10 vol %)

Example 1-2

An adhesive composition was prepared by mixing the following components:
i) A solution of 51.4 g of an ethylene-vinyl acetate copolymer (EVA 700, BAYER), whose vinyl acetate content is 70 wt %, in toluene/methyl ethyl ketone (35 vol %)
ii) A solution of 37.5 g of a styrene-maleimide copolymer (SMA 3000I Resin, SARTOMER), whose styrene content is 75 wt %, in methyl ethyl ketone (40 vol %)
iii) A solution of 75 g of a phenoxy resin (YP50, Tohto Kasei Co., Ltd. (Japan)), whose weight average molecular weight is 44,100, in toluene (20 vol %)
iv) 38 g of an epoxy acrylate polymer (SP1509, Showa Highpolymer (Japan)), 5 g of trimethylolpropane trimethacrylate and 6 g of 2-methacryloyloxyethyl phosphate as radical polymerizable materials
v) A solution of 30 g of benzoyl peroxide as a radical initiator in toluene (10 vol %)

Example 2-1

An adhesive composition was prepared by mixing the following components:
i) A solution of 88.6 g of an ethylene-vinyl acetate copolymer (EVA 700, BAYER), whose vinyl acetate content is 70 wt %, in toluene/methyl ethyl ketone (35 vol %),
ii) A solution of 12.5 g of a styrene-maleimide copolymer (SMA 3000I Resin, SARTOMER), whose styrene content is 75 wt %, in methyl ethyl ketone (40 vol %),
iii) A solution of 50 g of an acrylic resin (SG-80, Nagase Chemtex Corp. (Japan)), whose weight average molecular weight is 350,000, in toluene (20 vol %),
iv) 38 g of an epoxy acrylate polymer (SP1509, Showa Highpolymer (Japan)), 5 g of trimethylolpropane trimethacrylate and 6 g of 2-methacryloyloxyethyl phosphate as radical polymerizable materials,
v) A solution of 30 g of benzoyl peroxide as a radical initiator in toluene (10 vol %), and
vi) 2 g of insulated nickel particles having a size of 5 μm (T110, Inco (Canada)) as conductive particles.

Example 2-2

An adhesive composition was prepared by mixing the following components:
i) A solution of 45.7 g of an ethylene-vinyl acetate copolymer (EVA 700, BAYER), whose vinyl acetate content is 70 wt %, in toluene/methyl ethyl ketone (35 vol %),
ii) A solution of 37.5 g of a styrene-maleimide copolymer (SMA 3000I Resin, SARTOMER), whose styrene content is 75 wt %, in methyl ethyl ketone (40 vol %),
iii) A solution of 75 g of a phenoxy resin (YP50, Tohto Kasei Co., Ltd. (Japan)), whose weight average molecular weight is 44,100, in toluene (20 vol %),
iv) 38 g of an epoxy acrylate polymer (SP1509, Showa Highpolymer (Japan)), 5 g of trimethylolpropane trimethacrylate and 6 g of 2-methacryloyloxyethyl phosphate as radical polymerizable materials,
v) A solution of 30 g of benzoyl peroxide as a radical initiator in toluene (10 vol %), and
vi) 2 g of insulated nickel particles having a size of 5 μm (T110, Inco (Canada)) as conductive particles.

Comparative Example 1-1

An adhesive composition was prepared in the same manner as in Example 1-1 except that a solution of 132 g of a nitrile butadiene rubber (NBR)-based resin (N-34, Nippon Zeon Co., Ltd. (Japan)) in toluene/methyl ethyl ketone (25 vol %) was used instead of the component i).

Comparative Example 1-2

An adhesive composition was prepared in the same manner as in Example 1-2 except that a solution of 72 g of a nitrile butadiene rubber (NBR)-based resin (N-34, Nippon Zeon Co., Ltd. (Japan)) in toluene/methyl ethyl ketone (25 vol %) was used instead of the component i).

Comparative Example 1-3

An adhesive composition was prepared in the same manner as in Example 1-1 except that a solution of 108.6 g of an ethylene-vinyl acetate copolymer (EVA 700, BAYER), whose vinyl acetate content is 70 wt %, in toluene/methyl ethyl ketone (35 vol %) was used alone instead of the mixture of the components i) and ii).

Comparative Example 2-1

An adhesive composition was prepared in the same manner as in Example 2-1 except that a solution of 124 g of a nitrile butadiene rubber (NBR)-based resin (N-34, Nippon Zeon Co., Ltd. (Japan)) in toluene/methyl ethyl ketone (25 vol %) was used instead of the component i).

Comparative Example 2-2

An adhesive composition was prepared in the same manner as in Example 2-2 except that a solution of 64 g of a nitrile butadiene rubber (NBR)-based resin (N-34, Nippon Zeon Co., Ltd. (Japan)) in toluene/methyl ethyl ketone (25 vol %) was used instead of the component i).

Comparative Example 2-3

An adhesive composition was prepared in the same manner as in Example 2-1 except that a solution of 102.9 g of an ethylene-vinyl acetate copolymer (EVA 700, BAYER), whose vinyl acetate content is 70 wt %, in toluene/methyl ethyl ketone (35 vol %) was used alone instead of the mixture of the components i) and ii).

[Production of Anisotropic Conductive Films]

Each of the adhesive compositions was stirred at 300 rpm at room temperature (25° C.) for 150 minutes. The adhesive composition was applied to a silicon release-treated polyethylene base film using a casting knife and dried in a dryer at 80° C. for 5 minutes to form a 35 μm-thick anisotropic conductive film.

[Evaluation of Physical Properties of the Anisotropic Conductive Films]

The circuit connection performance characteristics of the anisotropic conductive films were evaluated in accordance with the following procedures. Each of the anisotropic conductive films was allowed to stand at room temperature (25° C.) for one hour. The film was connected to a printed circuit board, a chip-on-film (COF), and a tape carrier package (TCP) under preliminary pressing conditions (80° C., 1 sec, 1.0 MPa) and final pressing conditions (160° C., 4 sec, 3 MPa/200° C., 4 sec, 3 MPa). Five specimens were prepared for each film. The specimens were measured for 90° adhesive strength. After an appropriate amount of a silver paste was spread on the terminal IC portions of the COF and TCP, and the measurement points of the board were cleaned with an alcohol cotton swab, the connection resistance was measured by the 2-probe method.

The connection resistance was measured after the circuit connection structures were left standing under high temperature (85° C.) and high humidity (RH 85%) conditions for 500 hours to evaluate the connection reliability.

The thermal shock reliability was evaluated after 500 cycles of cooling/heating (−40° C./100° C., one hour per cycle). After the specimen was molded and polished, the bonding gaps between ITO glass, COF, and TCP were measured. The fluidity was evaluated by measuring the initial film width ($A_O$) and the film length ($A_T$) after elongation. The fluidity was calculated by the following equation.

$$\text{Fluidity}(\%) = A_T/A_O \times 100$$

The results are shown in Tables 1, 2, and 3 in FIGS. 1, 2, and 3, respectively.

In connection with the physical properties of the anisotropic conductive films, the test results in Tables 1, 2 and 3 can be interpreted as follows:

i) Adhesive Strength

Generally, a preferred anisotropic conductive film has an adhesive strength as high as about 800 gf/cm. From the results in Table 1, it can be confirmed that all anisotropic conductive films had adhesive strengths greater than 800 gf/cm, but the adhesive strengths of the anisotropic conductive films of Examples 1-1 through 2-2, each of which was produced by adding the ethylene-vinyl acetate copolymer and the styrene-maleic anhydride copolymer to the binder, were increased or remained constant even under high temperature and high humidity conditions or after thermal shock. In contrast, the results in Table 1 show that the adhesive strengths of the anisotropic conductive films of Comparative Examples 1-1, 1-2, 2-1, and 2-2, each of which used the nitrile butadiene rubber-based resin as a binder component, were greatly reduced under high temperature and high humidity conditions or after thermal shock, indicating that the adhesive strengths of the films cannot be maintained for a long period of time.

ii) Connection Resistance

A preferred anisotropic conductive film has a connection resistance not greater than 2Ω under the above test conditions to ensure sufficient conductivity. From the results in Table 2, it can be seen that the electrical resistance values of all anisotropic conductive films were within the available range at the initial stages under the final pressing conditions (160° C., 4 sec, 3.0 MPa/200° C., 4 sec, 3.0 MPa). However, the electrical resistance values measured after the reliability evaluation under the final pressing conditions show that there was no significant increase in the electrical resistance of the anisotropic conductive films of Examples 1-1 through 2-2, whereas the electrical resistance values of the anisotropic conductive films of Comparative Examples 1-1 through 2-3 were in the range of 2.74-5.95Ω, which were much higher than the available limit (2Ω).

Taking into consideration the fact that final pressing time and temperature gradually become shorter and lower, respectively, depending on processing conditions, high reliability, and electrical connection capability must be maintained even under high temperature and high humidity conditions and under thermal shock conditions, particularly when the final pressing time is 4 seconds or less. However, the results in Table 2 show that the anisotropic conductive films of Comparative Examples 1-1 through 2-3 did not satisfy the requirements of reliability and electrical connection capability.

In contrast, the connection resistance values of the anisotropic conductive films of Examples 1-1 and 1-2 without conductive particles were maintained at 2Ω or less under extreme conditions, such as high temperature and high humidity conditions and thermal shock conditions, indicating that the anisotropic conductive films can be practically used in a variety of devices and products for a long time without causing unstable electrical connection.

iii) Fluidity and Bonding Gap

It is preferred that the fluidity of the binder is about 70 to about 100%, as evaluated by the method suggested above. Below about 70%, poor connection reliability may be caused upon final pressing because the fluidity of the curing system is deteriorated. Above about 100%, a number of air bubbles may be generated due to an excessive flow of the curing system. As the fluidity increases, hot pressing facilitates the migration of the binder around conductive particles. This migration makes it easy to obtain electrical connection and reduces mechanical stress remaining in the cured film. Therefore, portions connected to the anisotropic conductive film are electrically and mechanically stable under extreme conditions for a long time. Referring to the data in Table 3, the anisotropic conductive films of Examples 1-1 through 2-2 showed higher fluidity than those of Comparative Examples 1-1 through 2-3.

The bonding gaps of the anisotropic conductive films produced according to the Comparative Examples were two or ten times larger than those of the anisotropic conductive films produced according to the Examples. The higher fluidity of the anisotropic conductive films of Examples 1-1 through 2-2 reduced the compression set and modulus of elasticity of the films when being cured to decrease the bonding gaps. As a result, the connection state of the films could be maintained stable. In contrast, the larger bonding gaps of the comparative anisotropic conductive films resulting from poor fluidity made the bonding state unstable, and as a result, an increase in connection resistance was observed during reliability testing despite good initial physical properties.

As apparent from the foregoing, the adhesive composition and the anisotropic conductive film according to embodiments may exhibit high adhesive strength and low connection resistance, which can be maintained even under high temperature and high humidity conditions and after thermal shock, and provide high fluidity and small bonding gaps.

In addition, the electrical conductivity of the anisotropic conductive film may be maintained stable even under final pressing conditions of a short time. Furthermore, high adhesive strength and low connection resistance of the anisotropic conductive film may be maintained under high temperature and high humidity conditions and after thermal shock, even in the absence of conductive particles or when using only a small amount of conductive particles. Therefore, a device using the anisotropic conductive film according to embodiments may have high reliability even after long-term use.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An adhesive composition, comprising:
   about 10 to about 40% by weight of an ethylene-vinyl acetate copolymer;
   about 5 to about 20% by weight of a copolymer of maleimide and styrene;
   about 1 to about 20% by weight of a binder resin;
   about 30 to about 60% by weight of a radical polymerizable material; and
   about 0.5 to about 5% by weight of a radical initiator.

2. An anisotropic conductive film produced using the composition as claimed in claim 1.

3. The composition as claimed in claim 1, further comprising conductive particles.

4. The composition as claimed in claim 3, wherein the conductive particles are present in an amount of about 0.01 to about 3% by weight.

5. The composition as claimed in claim 1, further comprising about 0.1 to about 5% by weight of a coupling agent.

6. The composition as claimed in claim 1, further comprising about 0.05 to about 0.5% by weight of an additive including at least one of a polymerization inhibitor, an antioxidant, and a heat stabilizer.

7. The composition as claimed in claim 1, wherein the ethylene-vinyl acetate copolymer contains vinyl acetate units in an amount of about 20 to about 80% by weight, based on the total weight of the ethylene-vinyl acetate copolymer.

8. An adhesive composition, comprising:
   an ethylene-vinyl acetate copolymer;
   a copolymer of maleimide and styrene;
   a binder resin;
   a radical polymerizable material;
   a radical initiator;
   conductive particles; and
   a coupling agent.

9. The composition as claimed in claim 1, wherein the copolymer of maleimide and styrene has a styrene content of about 50% or greater, based on the total weight of the copolymer.

10. The composition as claimed in claim 1, wherein the binder resin has a weight average molecular weight of about 10,000 to about 1,000,000 and includes at least one of a polyvinyl butyral resin, a polyvinyl formal resin, a polyester resin, a phenolic resin, an epoxy resin, a phenoxy resin, a urethane resin, and an acrylic resin.

11. The composition as claimed in claim 1, wherein the radical polymerizable material includes at least one of an acrylate, a methacrylate, a maleimide compound, and a compound having a phosphate ester structure.

12. The composition as claimed in claim 1, wherein the radical initiator includes at least one of a photopolymerization initiator and a heat curing initiator.

* * * * *